United States Patent [19]

Houghton

[11] 4,279,023
[45] Jul. 14, 1981

[54] SENSE LATCH

[75] Inventor: Russell J. Houghton, Essex Junction, Vt.

[73] Assignee: International Business Machines Corporation, Armonk, N.Y.

[21] Appl. No.: 105,050

[22] Filed: Dec. 19, 1979

[51] Int. Cl.³ ............................................. G11C 11/40
[52] U.S. Cl. ................................... 365/174; 365/203; 307/358
[58] Field of Search ............... 365/174, 189, 203, 230, 365/205; 307/238, 279, 358, DIG. 1

[56] References Cited

U.S. PATENT DOCUMENTS

| | | | |
|---|---|---|---|
| 3,678,473 | 7/1972 | Wohlstrom | 365/174 |
| 3,949,381 | 4/1976 | Dennard | 365/154 |
| 3,967,252 | 6/1976 | Donnelly | 365/154 |
| 3,993,917 | 11/1976 | Kalter | 307/235 |
| 4,010,453 | 3/1977 | Lewis | 365/174 |
| 4,054,865 | 10/1977 | Shinato | 307/238 |

*Primary Examiner*—Terrell W. Fears
*Attorney, Agent, or Firm*—Francis J. Thornton

[57] ABSTRACT

This describes a sense latch for a bipolar dynamic array in which each cell is comprised of a capacitor and a pnp-npn transistor. Cell information is stored in the capacitor. The capacitor may be either a discreet capacitor or may be formed as part of the base node of the pnp transistor. The sense latch of the invention comprises a pair of cross coupled transistors coupled between a pair of capacitively loaded bit lines of the array with one of the bit lines being coupled to a data cell and the other being coupled to a reference cell. Means for precharging the bit lines to a fixed voltage level and means for reading the cell to charge one of the bit lines to a level greater than the precharge level and apply a differential signal to the latch are also provided so that during the reading cycle one of the transistors in the latch becomes turned on so that the voltage levels of both bit lines are determined by the characteristics of the turned on transistor only. The voltage on one line is determined by the forward base-emitter characteristics of the turned on transistor and the voltage on the other line is determined by the saturated collector-emitter characteristics of the same turned on transistor.

18 Claims, 2 Drawing Figures

SENSE LATCH

BACKGROUND OF THE INVENTION

1. Field of the Invention

The invention relates to semiconductor memory cells and more particularly to sense latches used to read and write such memory arrays.

2. Related Inventions

U.S. patent application Ser. No. 866,126 filed Dec. 30, 1977 and assigned to the same assignee as the present invention, is directed to a bipolar dynamic array cell with which the present invention is particularly useful.

A U.S. patent application filed on even date herewith by the same inventor and assigned to the same assignee as the present invention is directed to a current source particularly useful with such a bipolar dynamic array.

3. Description of the Prior Art

U.S. Pat. No. 3,993,917 issued Nov. 23, 1976, to H. L. Kalter and assigned to the same assignee as the present invention describes a parameter independent field effect transistor sense amplifier for sensing stored information in a semiconductor memory system with the amplifier capable of sensing very small voltage signals provided by charges stored in single field effect capacitor memory cells. This amplifier comprises a pair of cross coupled FET devices coupled to a pair of sense lines by clock signal responsive switching devices and discharges one bit line through one field effect transistor while holding the other bit line as its precharged level.

U.S. Pat. No. 4,054,865 describes still another sense latch circuit. In this arrangement a plurality of different amplifiers corresponding to the number of columns of memory cells in the array is required.

U.S. Pat. No. 4,010,453 to S. C. Lewis and assigned to the same assignee as the present invention discloses still another differential sense amplifier for semiconductor memory cells. In this case however, both bit lines are arranged to lose charge simultaneously.

U.S. Pat. No. 3,678,473 issued July 18, 1972, to S. Walstrom and assigned to Shell Oil shows a FET sense latch in which the bit lines are preset and the latch is switched on, after the cell is read, to pull down the bit line with the lower charge, the other bit line being left substantially untouched.

Other sense amplifiers for semiconductor memories are shown in U.S. Pat. No. 3,949,381 and U.S. Pat. No. 3,967,252.

SUMMARY OF THE PRESENT INVENTION

The present invention is totally distinct from each of the above described prior art references for it teaches a cross coupled sensing latch in a memory, in which, during the reading cycle, one of the pairs of transistors in the latch becomes turned on so that it will discharge both bit lines. One bit line will be discharged through the collector-emitter path of the transistor and the other bit line will be discharged through the base-emitter path of the same transistor. Thus, the first line becomes discharged to a level of a set voltage while the second line is discharged to a voltage other than that of the set voltage because of the differences in the collector-emitter path and the base-emitter path of the device. The voltage on the second line tracks the first line because it is discharged through the same transistor. None of the known references teach this concept nor do they teach that any advantage might be realized discharging both bit lines through the same single device.

It is therefore an object of the invention to set forth a sense latch used in a memory array in which pairs of bit lines to be read are discharged through a single semiconductor device such that exact matching of the potential of the bit lines for every cell on the word line is not necessary.

It is still a further object of the invention to teach a cross coupled sensing latch in a memory array in which, during the reading cycles, one of the pairs of transistors in the latch becomes turned on so that it will discharge both bit lines coupled to the latch.

It is still another object of the present invention to provide an improved sense latch for bipolar memory dynamic cells.

The foregoing and other objects, features and advantages of the present invention may be fully realized from the following more particular description of the preferred embodiment of the invention as illustrated in the accompanying drawings.

DESCRIPTION OF THE PREFERRED EMBODIMENT

Turning now to the figures a description of the preferred embodiment of the present invention and its mode of operation will be given.

Figure 1:
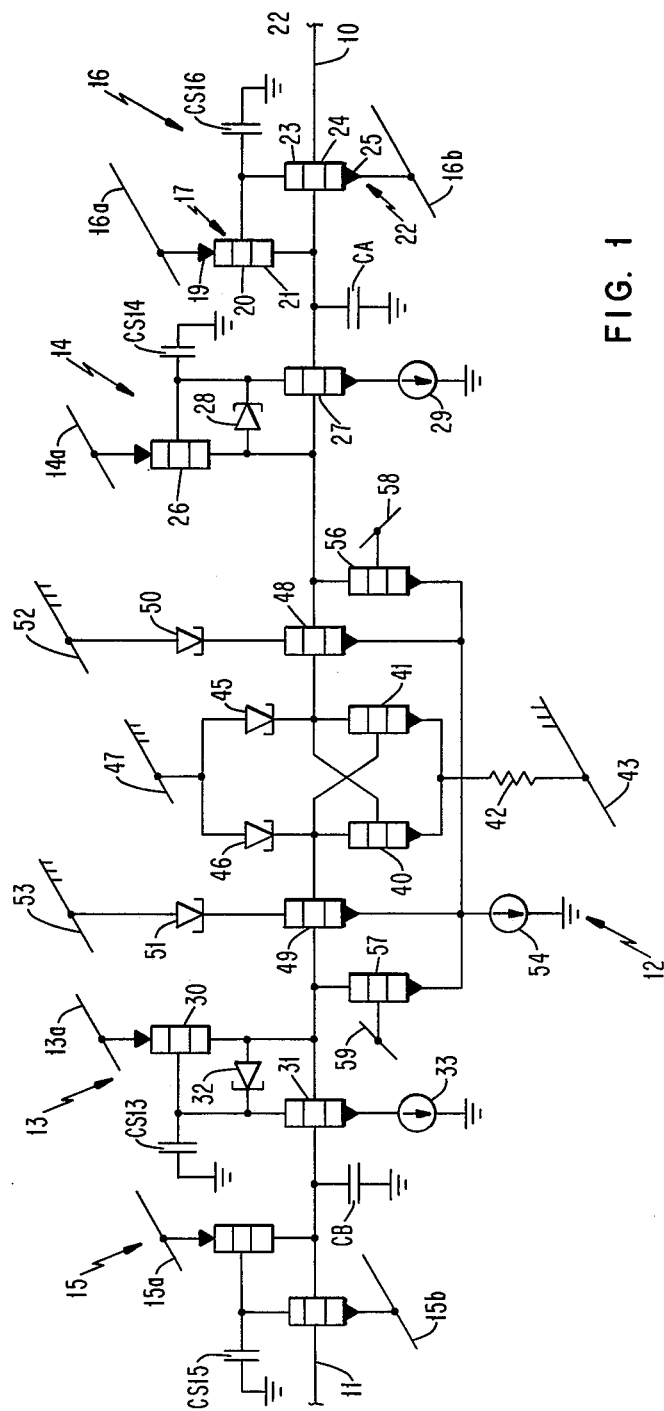
FIG. 1 is a schematic of a charge storage memory array useful with the present invention.
Figure 2:
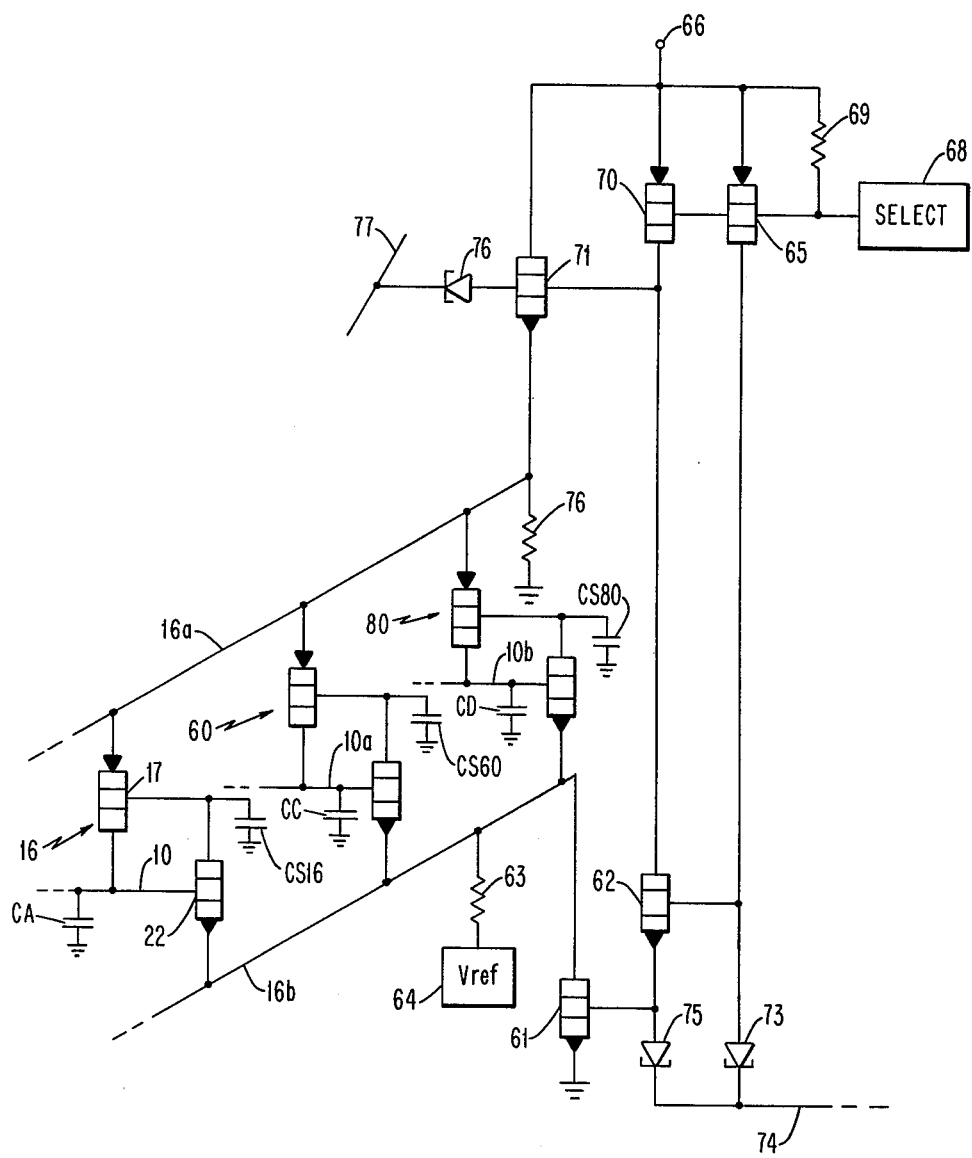
FIG. 2 is a schematic of a current supply means for driving current through the word lines of the array shown in FIG. 1 to bias each of the cells in the array with respect to their bit lines.

Turning first to FIGS. 1 and 2 there is shown a schematic circuit diagram of a portion of an integrated circuit memory array which includes a sense amplifier and a supply means for biasing the word lines of the array.

It will be understood by those skilled in the art that in an actual array there are normally provided many separate pairs of bit lines organized in rows and crossing columns of word lines. As shown in FIG. 1 each pair of bit lines, i.e., lines 10 and 11, are coupled to a single sense amplifier latching circuit 12. To each bit line there is attached a plurality of memory cells. The bit line 10 is shown as having two cells, 14 and 16, coupled thereto and bit line 11 is shown as having two cells, 13 and 15, coupled thereto. The two bit lines 10 and 11 each have the same number of data cells associated with it and each can have many data cells coupled to it. Each bit line also has associated with it one reference memory cell. On bit line 10 cell 14 serves as the reference cell and cell 16 as the data cell. On bit line 11 cell 13 serves as the reference cell and cell 15 as the data cell. As will be further explained, during each sensing cycle the reference or dummy cell associated with the unaddressed bit line is selected. Each cell 13, 14, 15, and 16 is associated with different addressable word lines. Thus reference cell 14 is coupled between ground and word line 14a, data or storage cell 16 is coupled between word lines 16a and 16b, reference cell 13 is coupled between ground and word line 13a, and data or storage cell 15 is coupled between word lines 15a and 15b. Bit line 10 has an inherent or distributed capacitance indicated by capacitor CA which is large compared with the storage capacitance CS of each memory cell. The bit line 11 has a similar inherent or distributed capacitance shown as capacitor CB.

Each data cell, for example, cell 16 is a destructively read, two device pnp-npn, dynamic cell having a storage node indicated by the capacitance CS 16 upon which data is stored. The pnp transistor 17 of the cell 16 has its emitter 19 coupled to a word line 16a and its collector 21 coupled to the bit line 10. The base 20 of this pnp transistor is connected to one side of the storage node capacitor CS 16 and to the collector 23 of an npn transistor 22. The base 24 of this npn transistor 22 is coupled to the bit line 11 and hence to the collector 21 of the pnp transistor 17. The emitter 25 of the npn transistor 22 is coupled to the second word line 16b.

When built in integrated circuit form the base 20 of the pnp transistor and the collector 23 of the npn transistor are common. The base 24 of the npn transistor and the collector 21 of the pnp transistor are also common regions.

The size of the inherent bit line capacitors CA and CB are each a function of the length of each respective bit line and the number of cells coupled thereto.

For the sake of convenience in the description, the storage capacitor CS in each cell will be treated as if it were a discreet capacitor. However, it should be understood that the storage node capacitor CS of each cell may be either a discreet capacitor or may be formed as a function of the base of the pnp transistor with respect to the substrate when the cell is formed as an integrated circuit in a body of semiconductor material.

The described cell is more fully set forth in copending U.S. patent application Ser. No. 886,126 above referenced. The pnp transistor 17 is used for reading data from the cell 16 and the npn transistor 22 is used for writing data into the cell 16. This reading and writing of the cell is more fully described below.

The reference cell on each line is substantially identical to the data cells and also comprises a pnp-npn cell. Cell 14 for example, which coupled to bit line 10 comprises a pnp transistor 26, and an npn transistor 27. Transistor 26 has its emitter coupled to word line 14a and its base to the collector of the npn transistor 27 and to one side of the storage capacitor CS 14. The collector of transistor 26 is connected to the bit line 10 and through a schottky diode 28 to the collector of transistor 27 whose base is also connected to the bit line 10. The emitter of transistor 27 is connected through a current source 29 to ground. The reference cell 13 coupled to bit line 11 is similar and is composed of pnp transistor 30, npn transistor 21, diode 32, current source 33 and a charge storage capacitor CS 13.

The sense amplifier latching circuit 12 comprises a pair of cross coupled latching transistors 41 whose emitters are coupled together and through a resistor 42 to a set line 43. The bases of each of these latching transistors are connected to the collector of the other and to a respective bit line. The base of transistor 40 is connected to the collector of transistor 41, to the bit line 10, and through a diode 45 to a restore line 47. The base of transistor 41 is connected to the collector of transistor 40, to the bit line 11, and through a diode 46 to the restore line 47.

On each bit line 10 and 11 there is also provided a respective sense transistor 48 and 49. On bit line 10 there is provided sense transistor 48 and on bit line 11 sense transistor 49. The emitters of both these sense transistors are coupled together and to a current source 54. The collector of the sense transistor 48 is coupled through a diode 50 to a data-out line 52 while the collector of transistor 49 is coupled through a diode 51 to the complementary data-out line 53.

Bit lines 10 and 11 also have respective write transistors 56 and 57 connected thereto. The emitters of each of these write transistors are also coupled to the current source 54 while their collectors are connected to the respective bit lines 10 and 11. The base of transistor 56 is connected to a data-in line 58 while the base of transistor 57 is connected to the complementary data-in line 59.

FIG. 2 depicts a supply circuit coupled across the word lines 16a and 16b. This circuit drives the word lines 16a and 16b to read and write the cells coupled thereto.

When an array is created, in integrated form, in a semiconductor body, the word lines, for example, 16a and 16b can be formed either, by diffusion or by depositing conductive metallic lines on the surface of the semiconductor body. If diffused, these word lines can exhibit a resistance of about 10 ohms between cells. Thus, for example, the line 16b would exhibit a 10 ohms resistance between cell 16 and cell 60 and another 10 ohms resistance between cell 60 and cell 80.

When conductive metallic lines are used they exhibit resistance drops of about 0.25 ohms between cells but even this low value can cause significant problems in the reading and writing of the cells when the arrays are very dense.

This problem is best illustrated as follows. If we assume that we are to write information into the cells 16, 60 and 80 coupled to word lines 16a and 16b, shown in FIG. 2 and that these word lines are very resistive and each bit line has an independent fixed DC drive voltage supply, of say 1.3 volts, connected thereto then when line 16b is pulled low with respect to the bit lines 10, 10a and 10b the voltage difference between some of the bit lines and the word line might be so low as to prevent the cells most distant from the word line supply from turning on. For example, if each bit line were biased at 1.3 volts and the word line 16b is pulled low towards ground through transistor 61 of the circuit shown in FIG. 2 then the npn transistor of cell 80 sees about 0.8 volts between its base and emitter and turns on. When it turns on current flows through the npn transistor of cell 80 thus the word line voltage at the emitter of the npn transistor of the next cell 60 with respect to the bit line 10a is changed such that the voltage differential between the word line 16b and the bit line 10a of cell 60 is less than 0.8 volts. The actual change in voltage is dependent on the current flow and the resistance of the line 16b.

If the voltage difference on the cell 60 is sufficient it too turns on and contributes additional flow which further changes the voltage on the word line 16b with respect to the bit line 10 in the cell 16. Thus, as one goes further along the word line 16b the voltage differential between the bit line of any cell and the word line 16b can fall below the voltage needed to turn on the cell. Thus the density of the array is limited by the resistance of the word line when each bit line is provided with its own fixed voltage supply. Because the applied DC voltage drives the npn transistor of any turned on cell into saturation, current flow in each turned on cell continues even after the storage capacitor of the turned on cell reaches its final state. Thus the most distant cells on the word line, in a very dense array, never realize a sufficient voltage difference to turn on. It was thought that if the DC bit line voltage supplies were sequentially shut off, after a selected period of time, beginning with the cell closest to the word line voltage driver circuit that the problem could be avoided. This sequential switching off was found, however, so time consuming as to make large arrays impractical.

Thus large arrays of such npn-pnp transistor cells remained impractical until the present inventor realized that the cells can be driven such that the distributed capacitance of the bit line can be used to turn on and charge each cell and that fixed DC bit line drive voltages are unnecessary.

By so using the bit line capacitance the word line resistive drop problem described above is avoided. This will be better understood from the following description taken in conjunction with FIG. 2 which shows a word drive voltage supply means coupled across the word lines 16a and 16b with cells 16, 60 and 80 therebetween. Cell 16 is coupled to bit line 10, cell 60 is coupled to a parallel bit line 10a and cell 80 is coupled to still another parallel bit line 10b. This supply circuit is to bias the cells connected to the word lines with respect to the respective bit lines to which each cell is coupled. This circuit is used to set the voltage of the word lines to read and write the cell. This circuit selectively drives the voltage of the word lines such that the respective bit line capacitor will serve to turn on the cell and set the charge on the cell storage node capacitor. The rate at which the cell storage node capacitor reaches the selected charge state is, of course, a function of the current-resistive-voltage drops of the word line, and state of the bit line capacitance as well as a function of the charge state of any cell storage node capacitance between the selected cell and the current supply circuit. This means that exact matching of the bit line potentials for every cell on the selected word line is unnecessary.

This current supply circuit comprises a pull down transistor 61 having its base drive supplied by a second npn drive transistor 62 and its emitter coupled to ground. The collector of transistor 61 is connected to the word line 16b and its base to the emitter of the drive transistor 62. Also shown connected to the word line 16b is a resistor 63 which couples the line 16b to a 1.6 volt reference voltage supply 64. The collector of transistor 62 is connected to the collector of a pnp transistor 70, the base of still another npn transistor 71 and through a diode 76 to a word line recovery circuit 77. The base of transistor 62 is coupled to the collector of a second pnp transistor 65 and through a schottky diode 73 to a read regeneration line 74 while its emitter is coupled to the base of transistor 61 and through still another schottky diode 75 to the same read regeneration line 74.

The bases of the pnp transistors 70 and 65 are both coupled to a source 68 of select pulses and through a resistor 69 to a five volt voltage source 66. This same voltage source 66 is also coupled to the collector of the npn transistor 71 and to the emitters of the pnp transistors 70 and 65. The emitter of transistor 71 is connected to the word line 16a and to ground through a resistor 76.

Before performing a write operation the bit lines 10 and 11, shown in FIG. 1, are placed in standby. To reach this standby condition the emitter-base junction of the npn transistors 31 and 27 of the reference cells 13 and 14 respectively are both forward biased by turning on the respective current sources 33 and 29, while applying a positive voltage to the restore line 47 from a suitable power supply (not shown). This causes a reset current to flow from the restore line 47 through the schottky diodes 45, 46, 32 and 28. In cell 13 this current flow path from the restore line 47 to ground is through the npn transistor 31, the schottky diode 32 and the load diode 46. In cell 14 the current path is similar, that is, through transistor 27, diode 28 and diode 45. This current flow sets and holds both the bit lines 10 and 11 at the same equal potential.

A write 1 operation, for example, on cell 16 will now be described in conjunction with FIGS. 1 and 2. Initially the current sources 29 and 33 are shut off, restore line 47 is brought low to reverse bias diodes 45 and 46 and a select pulse is applied from the select source 68 to the bases of pnp transistors 65 and 70. Simultaneously the WP recovery line 77 at the cathode of diode 76 is raised to 4.2 volts by a suitable power supply (not shown) and the read/regeneration line 74 is held at −0.6 volts by a suitable power supply (not shown).

The current supplied by source 68 to transistors 65 and 70 drives them on. As transistor 70 turns on the base of npn transistor 71 rises because the WP recovery line 77 is high and the diode 76 does not conduct. Transistor 71 turns on and the word line 16a is pulled up to 4.0 volts by the voltage source 66. Because the read regeneration line 74 remains low, the diodes 73 and 75 both conduct and the bases of transistors 61 and 62 are both held below their turn on voltage. Thus, transistors 61 and 62 remain off and the word line 16b remains held at its normal quiescent voltage by the 1.6 volt reference voltage source 64. The word line 16a is now at approximately 4.0 volts and the word line 16b is at +1.6 volts.

When the word line 16a rises to 4 volts, pnp transistor 17 turns on and the storage node CS 16 of the cell 16, at the base of pnp transistor 17 and the collector of npn transistor 22, charges to 4 volts less the emitter-base voltage of the pnp transistor 17. Normally, in such pnp transistors, the emitter-base voltage drop is approximately 0.8 volts. Thus, 3.2 volts appears on the storage node CS 16.

Concurrently, the bit line latch 12 is controlled by a write 1 command from a suitable power supply (not shown), which sets the input line 59, at the base of transistor 57, at 1.4 volts while holding the line 58, at the base of transistor 56, at ground. This turns on transistor 57 which pulls down the bit line 11 and the base of transistor 41. Transistor 41 shuts off and transistor 40 turns on to hold the bit line 11 lower than bit line 10 as is later described in greater detail. The latch 12 is now set. Following this, the word line 16a is returned to this quiescent state by applying a positive voltage to the read regeneration line 74 reverse biasing diodes 73 and 75 causing transistors 62 and 61 to turn on. Transistor 62 conducts and pulls down the base of transistor 71 shutting transistor 71 off. This permits the voltage on word line 16a to be reduced to its quiescent level via resistor 76. As transistor 61 turns on, the line 16b is pulled down to 0.1 volts. Thus, the emitter of the npn transistor in each cell is also pulled low.

Now, if the bit line capacitances of all the cells coupled to the word line is charged, they act as if they were voltage supplies on all the respective npn transistors with respect to the word line 16b. The npn transistors in each respective cell thus try to turn on to discharge the storage node of each cell as well as the bit line capacitance coupled to it.

For example, if it is assumed that when device 61 turns on, each bit line capacitance CA, CC and CD, coupled to each respective cell 16, 60 and 80, is fully charged then the respective npn transistor of cells 80, 60 and 16 all try to turn on.

Because cell 80 is closest to the word line biasing transistor 61, it turns on first. And as it turns on, the cell capacitor CS 80 begins to change its state causing current to flow in the word line and through transistor 61. As explained above, this current flow causes a voltage drop on the word line 16b so that the voltage differential between the word line 16b, at the emitter of the npn transistor of cell 60, and the bit line 10a is below that voltage differential applied to the emitter of npn transistor of cell 80 with respect to the bit line 10b. Thus, the npn transistor of cell 60 does not turn on as fully as does the npn transistor of cell 80. However, as it turns on, it also contributes current flow to the word line 16b by discharging the sense capacitor CS 60. Thus, the voltage at the emitter at transistor 22 of cell 16 is reduced even more depending upon the number of cells between cell 16 and the biasing transistor 61 and the resistance of the word line 16b and the amount of current flow.

If the resistance of the line 16b is high enough, or if there is sufficient number of cells between cell 16 and transistor 61, cell 16 will not initially turn on because the voltage drop in the line 16b is such that the voltage differential between the line 16b and the bit line 10 of cell 16 will be insufficient to cause cell 16 to turn on.

However, as each npn transistor turns on the bit line capacitance of each cell discharges until the voltage difference between the bit line, of the turned on cell, and the word line 16b reaches a level where it is no longer sufficient to contribute a significant current flow on the word line. As each turned on cell along the word line reaches this condition, the voltage across the base-emitter of the npn transistor of a cell further along the word line which is not yet turned on now receives a sufficient base drive so that it also turns on. Thus as the current contributed by each turned on cell falls the voltage on the word line with respect to the bit line of the more distant cell proportionally rises to a level sufficient to cause the more distant cell to turn on.

Of course, if the bit line capacitance of any cell is already discharged so that there is no effective base drive voltage on the npn transistor, the cell will not turn on and does not contribute to the current flow and voltage drop in the word line.

Thus, the rate in which the last cell in the word line changes, in this example, cell 16, is a function of the state of each cell 60 and 80 between it and the biasing transistor 61.

When the npn transistor 22 of cell 16 becomes forward biased and discharges the storage node CS 16 and the bit line capacitance CA of bit line, the bit line capacitance CA discharges to about 0.75 volts and the storage capacitor CS 16 is discharged to about 0.1 volts.

Once this state is achieved in the capacitors CA and CS 16 the select pulse from source 68 is terminated causing transistors 65, 70, 62 and 61 to all turn off and the word line 16b is recovered up to its normal quiescent voltage level of 1.6 volts by the reference voltage source 64 via resistor 63. At the same time, bit line 10 is restored to its quiescent level causing the storage node CS 16 to be raised to 0.5 volts by the forward biased collector-base junction of the npn transistor 22. If the cell is now held in this state for at least two milliseconds the storage node CS 16 charges to about 0.9 volts. The exact voltage to which the storage node rises is determined by the forward characteristic of the collector-base junction common to npn transistor 22 and pnp transistor 17. In this manner, a 1 is stored in the cell 16.

Once the cell is written the bit lines 10 and 11 are returned to the standby condition as above described.

Reading of the cell 16 having a 1 stored therein will now be described. To read the 1 stored in the cell 16 the word line 16a must again be raised to 4.0 volts.

This is accomplished by holding the read regeneration line 74 low while applying a select current to the base of transistors 70 and 65 and raising the voltage on the WP recovery line 77. Again line 16a rises to approximately 4 volts. Also current sources 29 and 33 are shut off and restore line 47 is lowered to reverse bias the diodes 45 and 46. The bit line capacitances CA and CB of bit line 10 and 11 are at this time equally charged at approximately 1.10 volts.

When the word line 16a rises to 4.0 volts, transistor 17, of cell 16, turns on and charges the capacitor CA an additional 0.1 volts. The word line 14a of reference cell 14 is held low so as to keep reference cell 14 off. Simultaneoulsy the word line 13a of the reference cell 13 is set at a voltage of 2.9 volts which is approximately 1.1 volts lower than the voltage applied to the word line 16a and the bit line capacitance CB of the bit line 11 is charged an additional 0.05 volts i.e. by half the additional amount that the bit line capacitance CA of the bit line 10 has been charged. Thus the capacitor CB of the bit line 11 is now charged to 1.15 volts and the capacitor CA of bit line 10 is now charged to 1.20 volts. Since both the data cell 16 and the reference cell 13 have been made substantially identical, good tracking between the cells is obtained. Once these voltage levels have been obtained the set line 43 is lowered from its quiescent voltage of 1.10 volts supplied by a suitable power supply (not shown) to 0.1 volts to establish a current flow through the resistor 42. Because the voltage on capacitor CA and hence on bit line 10 is higher than the voltage on bit line 11, by 0.05 volts, transistor 40 turns on. This causes capacitor CB to discharge through the collector-emitter path of transistor 40 while the bit line capacitor CA of bit line 11 simultaneously discharges through the forward biased base-emitter junction of the transistor 40 until the collector-base junction of transistor 40 becomes forward biased. This occurs when the voltage on bit line 11 falls to a point where it is lower than the voltage on bit line 10 only by a value equal to the collector-base forward voltage of transistor 40 which is approximately 0.65 volts. The initial 0.05 volt offset between the bit lines 10 and 11 has now been amplified to about 0.60 volts. These voltages are determined by the transistor action and current flow of the discharging device 40. This high voltage level on bit line 10 indicates that a 1 had been written in the cell 16 connected to bit line 10. This differential voltage can be detected on lines 52 and 53 because transistor 48 of the sense pair 48 and 49 is turned on by the 0.65 volts offset between bit lines 10 and 11. Once the cell is read, the bit lines 10 and 11 are returned to standby as above described. Also, the emitters of the npn transistors 31 and 27 of the reference cells 13 and 14 respectively are both reset by turning on their respective current sources 33 and 29. This causes a reset current to flow from the restore line 47 through the schottky diodes 45, 46, 32 and 28. In cell 13, this current flow path from the restore line 47 to ground is through the npn transistor 31, the schottky diode 32 and the load diode 46. In cell 14 the current path is similar, that is, through transistor 27, diode 28 and diode 45. This current flow again sets both the bit lines 10 and 11 at the same equal potential as previously described in conjunction with the write 1 cycle. Having now described a write 1-read 1 operation a write 0-read 0 operation will be set forth.

To write a 0 in cell 16 a select current pulse is applied from select source circuit 68 to the base of the pnp transistors 65 and 70 in the circuit shown in FIG. 2, to turn them on. Simultaneously, the WP recovery line 77 at the cathode of diode 76 is raised to 4.2 volts and the read regeneration line 74 continues in its low quiescent state at −0.6 volts. As transistor 70 turns on, the base of the npn transistor 71 also rises. Because the WP recovery line 77 is high, the diode 76 does not conduct, and transistor 71 turns on to pull the word line 16a up to 4.0 volts.

Because the read-regeneration line 74 remains low at −0.6 volts, transistor 61 and 62 remain off.

When the word line 16a gets pulled up through transistor 71 to 4 volts, the pnp transistor 17 turns on and the storage node CS 16 of the cell 16, at the base of transistor 17 and the collector of the npn transistor 22, charges to 4 volts less the emitter base voltage of the pnp cell transistor 17. Normally, in such pnp transistors the emitter-base voltage drop is approximately 0.8 volts. Thus, 3.2 volts appears on the storage node CS 16. Concurrently, the latch 12 is controlled by a write 0 command which sets the input line 59, at the base of transistor 57, at ground and the input line 58, at the base of transistor 56, at 1.4 volts. This forces the latch 12 to become set by pulling down the base of transistor 40 to shut it off and to cause transistor 41 to turn on which holds the bit line 10 low.

When transistor 61 turns on, the line 16b is pulled down. Because bit line 10 is held low transistor 22 of cell 16 remains off and the storage node CS 16 remains charged to 3.2 volts.

Following this, the word line 16a is returned to its normal quiescent state by raising the read regeneration line 74 to 1.6 volts causing diodes 75 and 73 to turn off so that transistors 62 and 61 turn on and pull down the base of transistor 71 and shut off transistor 71. When transistor 71 shuts off the word line 16a is pulled low to its quiescent level by resistor 76.

Once this state is achieved, in the storage node CS 16, the select pulse 68 is terminated turning off the transistors 61, 62, 65 and 70 which permits word line 16b to return to its quiescent level. In this manner, a 0 is stored in cell 16. The bit lines 10 and 11 are again returned to standby as above described.

Reading of the storage cell, 16, having a 0 stored therein, will now be described. To read the 0 stored in the cell the word line 16a must again be raised to 4.0 volts. Again, this is accomplished by holding the read regeneration line 74 low at −0.6 volts while applying a select current to the base of transistors 70 and 65 and raising the voltage on the WP recovery line 77. This causes line 16a to again rise to approximately 4.0 volts. Again, current sources 29 and 33 are shut off and the restore line 47 is lowered to reverse bias the diodes 45 and 46 of the latch 12.

The bit line capacitance CA and CB of bit lines 10 and 11 are at this time equally charged at approximately 1.10 volts. The word line 14a of reference cell 14 is held low to keep reference cell 14 off. Simultaneously the word line 13a of the reference cell 13 is set at a voltage of approximately 2.9 volts which is 1.1 volts lower than the voltage applied to the word line 16a. *The voltage applied to the line 13a is thus chosen so that the bit line* 11 is charged to a higher voltage than the bit line 10. Thus, the capacitor CB of the bit line 11 is now charged to approximately 1.15 volts, while the capacitance of CA of the bit line 10 remains at 1.10 volts. Since both the data cell 16 and the reference cell 13 are substantially identical good tracking between the devices is again obtained.

Once these voltage levels have been achieved, the set line 43 is lowered from its quiescent voltage of 1.10 volts to approximately 0.1 volts to establish a current flow through the resistor 42. Because the voltage on capacitor CB and hence on bit line 11 is now higher than the voltage on bit line 10 by 0.05 volts, transistor 41 turns on. This turning on of transistor 41 caused by capacitor CB on bit line 11 applying base drive to transistor 41, causes bit line capacitor CB to discharge through the now forward biased base-emitter junction of transistor 41 and the bit line capacitor CA of bit line 10 to discharge through the collector-emitter path of transistor 41. Ultimately the collector-base junction of transistor 41 becomes forward biased. When this occurs, the voltage on bit line 10 is lower than the voltage on bit line 11 by the collector-base voltage of transistor 41 which is approximately 0.65 volts. The initial 0.05 volt offset between the bit lines 10 and 11 has now been amplified about 0.60 volts. These voltages are determined by the transistor action and current flow of the discharging device 41. This lower voltage level on bit line 10 indicates that a 0 had been written in the cell 16 connected to the bit line 10. As shown in FIG. 2, the current circuit of FIG. 2 simultaneously supplies current to a number of different cells all connected to the same word line but coupled to separate and distinct bit lines. Thus, as shown in FIG. 2 the select current circuit is coupled to cell 16 on bit line 10, and to cell 60 on bit line 10a and cell 80 on bit line 10b. Thus, each cell connected between the word lines, 16a and 16b will charge in accordance with the current supplied through the current source. The rate at which any specific cell is written is a function of the state of every other cell between the specified cell being written and the current source coupled to the word line as well as the current-resistive effect of the word line itself. Thus, in the described instance, the rate at which the cell 16 is written is a function of the state of all the cells 60, and 80, positioned between the cell 16 and the current source circuit during the word lines 16a and 16b.

While the invention has been particularly shown and described with reference to preferred embodiments thereof, it will be understood by those skilled in the art that various changes in form and details may be made therein without departing from the spirit and scope of the invention.

What is claimed is:

1. A memory array comprising:
   first and second bit lines, each bit line having a distributed capacitance,
   a charge storage data cell coupled to one of said bit lines,
   a charge storage reference cell coupled to the other of said bit lines,
   a sense amplifier comprising;
   first and second voltage nodes, and
   first and second cross coupled latching transistors, each having an emitter, a base and a collector, the collector of each transistor being connected to a respective bit line and to the base of the other latching transistor and coupled to said first voltage node and the emitter of each transistor being connected in common and coupled to said second voltage node, means for writing information into said data cell, and means for reading information stored in the data cell by referring it to the state of the reference cell and turning on one of said cross coupled transistors to discharge both bit lines through said turned on cross coupled transistor to amplify the stored information and preset the bit lines to the voltage levels required to write the data cell.

2. The array of claim 1 further including first and second sense lines coupled to said sense amplifier, and first and second write lines.

3. The array of claim 2 wherein said sense amplifier further includes first and second sense transistors, each having an emitter, a base and a collector, the emitters being coupled in common and to a current source, the base of each transistor being coupled to the collector of a respective one of said cross coupled transistors and the collector of each being coupled to a respective sense line.

4. The array of claim 3 wherein said sense amplifier further includes first and second write transistors each having an emitter, a base and a collector, the collector of each being connected to the collector of a respective one of said cross coupled transistors, the emitter of each being coupled in common and to said current source and the base of each being coupled to a respective write line.

5. The array of claim 4 wherein said data cell and said reference cell each comprises a pair of complementary semiconductor transistor devices and a storage capacitor.

6. The array of claim 5 wherein said means for writing information into said data cells comprises means for setting the storage capacitor of said data cell at a selected voltage level.

7. The array of claim 6 wherein there is further provided means for setting the storage capacitor of said reference cell at a selected voltage level different from that level to which the data cell was set.

8. The array of claim 6 wherein there is further provided means for setting the storage capacitor of said reference cell at a voltage level less than that level at which the storage capacitor of said data cell was set.

9. The array of claim 6 wherein there is further provided means for setting the storage capacitor of said reference cell at a voltage level greater than that level at which the storage capacitor of said data cell was set.

10. In a memory array a sense latch comprising a pair of sense transistors, the bases of each being coupled to a respective one of a pair of capacitively loaded bit lines, a current source coupled to the emitters of said sense transistors, a pair of sense lines coupled to the collectors of said sense transistors, a pair of cross coupled latching transistors the collectors of each being coupled to a respective bit line and to a respective one of said bases of each sense transistor, a set line coupled to the emitters of said latching transistors, one of said bit lines being coupled to a data cell and the other of said bit lines being coupled to a reference cell, means for precharging the bit lines to a fixed voltage level coupled to said bit lines, and means for reading the data cell by referring it to the reference cell which sets one of said bit lines to a reference voltage other than the fixed voltage to turn on one of said cross coupled transistors in said latch to discharge both bit lines through said turned on cross coupled transistor to amplify the stored data.

11. In a memory array a sense latch comprising a pair of cross coupled transistors, the collectors of each being coupled to a respective one of a pair of capacitively loaded bit lines, a set line coupled to the emitters of said transistors, one of said capacitively loaded bit lines being coupled to a data cell and the other of said capacitively loaded bit lines being coupled to a reference cell, means for precharging the bit lines to a fixed positive voltage level, and means for reading the data cell by referring it to the reference cell which sets one of said capacitively loaded bit lines to a reference voltage and turns on one of said cross coupled transistors to discharge both bit lines through said turned on cross coupled transistor to amplify the data stored in said data cell.

12. The sense latch of claim 11 wherein said precharging means comprises a pair of diodes, a restore line, a pair of write transistors, a pair of complementary write lines, and a common current source, each of said diodes being connected between said restore line and the collector of a respective one of said pair of cross coupled transistors, and each of said write transistors having a collector emitter path coupled between a respective one of said bit lines and said common current source and a base connected to a respective one of said complementary write lines to selectively write information into said data cell.

13. The array of claim 1 wherein each of said cells comprise an NPN transistor coupled to a PNP transistor, the base of said PNP transistor being common with the collector of said NPN transistor and capable of storing charges.

14. The array of claim 13 wherein said distributed capacitance discharges through the base-emitter junction of said NPN transistor and said charge storage means discharges through the collector-emitter path of said NPN transistor.

15. The array of claim 14 wherein said data cell is coupled between a pair of word lines and a supply means is coupled across said pair of word lines.

16. The array of claim 1 wherein each data cell comprises a PNP transistor and an NPN transistor each having an emitter, a base and a collector and one of said word lines is connected to the emitter of said NPN transistor and the other of said word lines is connected to the emitter of said PNP transistor.

17. The array of claim 1 wherein each data cell comprises a PNP transistor and an NPN transistor each having an emitter, a base and a collector, the emitter of the NPN transistor being connected to a first word line, the emitter of said PNP transistor being connected to a second word line, supply means being coupled across said word lines, said first word line being driven to cause the selected cell storage means to reach a predetermined charge state, and said second word line being selected with respect to said bit line to discharge said charge cell storage means and said distributed capacitance on said bit line.

18. A sense circuit comprising a pair of cross coupled bipolar latching transistors the collector of each being coupled to a respective capacitive load, a set line coupled to the emitters of said transistors, means for precharging the loads to a fixed voltage level, signal means coupled to said loads for setting one of the loads to a voltage level greater than the voltage level on the other of said loads, and means for reading the set voltage levels on said loads by referring the voltage level on one of said loads to the voltage level on the other of said loads to turn on one of said cross coupled transistors in said latch to discharge both loads to different levels through the said turned on cross coupled transistor.

* * * * *